(12) United States Patent
Doi et al.

(10) Patent No.: US 7,829,406 B2
(45) Date of Patent: Nov. 9, 2010

(54) METHOD OF MANUFACTURING SEMICONDUCTOR DEVICE

(75) Inventors: Shunsuke Doi, Yokkaichi (JP); Yukiteru Matsui, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 70 days.

(21) Appl. No.: 12/208,372

(22) Filed: Sep. 11, 2008

(65) Prior Publication Data

US 2009/0075487 A1 Mar. 19, 2009

(30) Foreign Application Priority Data

Sep. 13, 2007 (JP) .............................. 2007-238364

(51) Int. Cl.
*H01L 21/8238* (2006.01)
(52) U.S. Cl. ................... 438/207; 438/692; 438/750; 216/56; 216/84
(58) Field of Classification Search ................ 438/207, 438/692, 693, 750; 216/58, 84, 88, 89
See application file for complete search history.

(56) References Cited

U.S. PATENT DOCUMENTS

| 6,224,464 | B1 | 5/2001 | Nojo et al. | |
| 6,429,134 | B1 * | 8/2002 | Kubota et al. | 438/692 |
| 7,101,801 | B2 * | 9/2006 | Ono et al. | 438/693 |
| 2005/0126080 | A1 * | 6/2005 | Kon et al. | 51/308 |
| 2008/0081542 | A1 * | 4/2008 | Hong et al. | 451/37 |

FOREIGN PATENT DOCUMENTS

| JP | 3278532 | 2/2002 |
| JP | 2005-142489 | 6/2005 |
| KR | 0591647 | 6/2006 |
| KR | 2007-55770 | 5/2007 |

OTHER PUBLICATIONS

Notification for Filing Opinion mailed Jun. 24, 2010, in corresponding Korean Patent Application No. 10-2008-90523 and English-language translation thereof.

* cited by examiner

*Primary Examiner*—Phuc T Dang
(74) *Attorney, Agent, or Firm*—Finnegan, Henderson, Farabow, Garrett & Dunner, L.L.P.

(57) ABSTRACT

Disclosed is a method of manufacturing a semiconductor device, which includes forming an insulating film above a semiconductor substrate having a recess and stopper film formed above the semiconductor substrate excluding the recess, thereby filling the recess with the insulating film, performing a first polishing by polishing the insulating film by means of a chemical mechanical polishing method using a first polishing liquid containing cerium oxide and first anionic surfactant, thereby obtaining a flattened surface, and performing a second polishing by polishing the flattened insulating film using a second polishing liquid containing cerium oxide and a second anionic surfactant having a smaller molecular weight than that of the first anionic surfactant under a polishing condition which differs from that of the first polishing, thereby exposing the stopper film.

20 Claims, 2 Drawing Sheets

METHOD OF MANUFACTURING SEMICONDUCTOR DEVICE

CROSS-REFERENCE TO RELATED APPLICATIONS

This application is based upon and claims the benefit of priority from prior Japanese Patent Application No. 2007-238364, filed Sep. 13, 2007, the entire content of which is incorporated herein by reference.

BACKGROUND OF THE INVENTION

1. Field of the Invention

This invention relates to a method for manufacturing a semiconductor device. In particular, this invention relates to a chemical mechanical polishing method (CMP) which is designed to be employed in the manufacture of a high-speed semiconductor device such as a memory LSI, a high-speed logic LSI, a system LSI, a memoryΩlogic hybrid LSI, etc.

2. Description of the Related Art

In recent years, the chemical mechanical polishing (CMP) method has been mainly employed as a planarization method to be used in the manufacturing process of a semiconductor device. As one of representative processes in which the CMP method is employed, there is known an element isolation technique called shallow trench isolation (STI). In the STI technique, a silicon nitride film is formed as a stopper film for CMP on the surface of a silicon substrate and then a shallow trench is formed in the silicon nitride film and in the silicon substrate, after which a silicon oxide film is deposited so as to fill the trench with the silicon oxide and then subjected to CMP to thereby remove a redundant portion of the silicon oxide film which is existed in regions other than the trench, thereby forming an element isolation region.

As for the polishing liquid to be employed in the CMP process for the STI, there is known to employ a polishing liquid containing cerium oxide as a polishing agent and an anionic polymer surfactant such as poly(ammonium carboxylate) as an additive (see for example, JP Patent No. 3278532 and JP-A 2005-142489).

Cerium oxide has a property that exhibits a higher polishing rate to a silicon oxide film than silica or alumina. On the other hand, the anionic polymer surfactant has a property that can be adsorbed on a silicon nitride film acting as a stopper film to suppress the polishing rate of the silicon nitride film, thereby enhancing the selective ratio of polishing rate between the silicon nitride film and the silicon oxide film. Further, this surfactant has also a property that enables to adsorb onto or desorb from the surface of cerium oxide particles depending on the polishing pressure, thereby making it possible to control the activity of the abrasive particles and hence to improve the polishing pressure dependency of polishing rate, thus enhancing the flatness of the polished surface.

However, due to the trend in recent years to further enhance the miniaturization of LSI in the vertical direction as well as in the lateral direction thereof, there have been raised the following outstanding problems in the CMP process for creating the STI. Namely, firstly, due to the increased miniaturization in lateral direction of LSI, minute flaws (scratches) on a silicon oxide film that may be caused to generate during the CMP and that may not arise any problem up to date are now having a bad effect on the electrical properties of a device, thereby reducing the yield. Secondly, due to the increased miniaturization in vertical direction of LSI, the thinning of the stopper film is inevitably promoted, whereby the suppression of the polishing rate of silicon nitride film would become insufficient, thereby making it impossible to secure a sufficient selective ratio between the silicon nitride film and the silicon oxide film. Thirdly, it is difficult to detect the termination of polishing especially on the occasion of applying a low polishing pressure.

BRIEF SUMMARY OF THE INVENTION

According to one aspect of the invention, there is provided a method of manufacturing a semiconductor device, which comprises forming an insulating film above a semiconductor substrate having a recess and stopper film formed above the semiconductor substrate excluding the recess, thereby filling the recess with the insulating film; performing a first polishing by polishing the insulating film by means of a chemical mechanical polishing method using a first polishing liquid containing cerium oxide and first anionic surfactant, thereby obtaining a flattened surface; and performing a second polishing by polishing the flattened insulating film using a second polishing liquid containing cerium oxide and a second anionic surfactant having a smaller molecular weight than that of the first anionic surfactant under a polishing condition which differs from that of the first polishing, thereby exposing the stopper film.

DETAILED DESCRIPTION OF THE INVENTION

Figure 1:
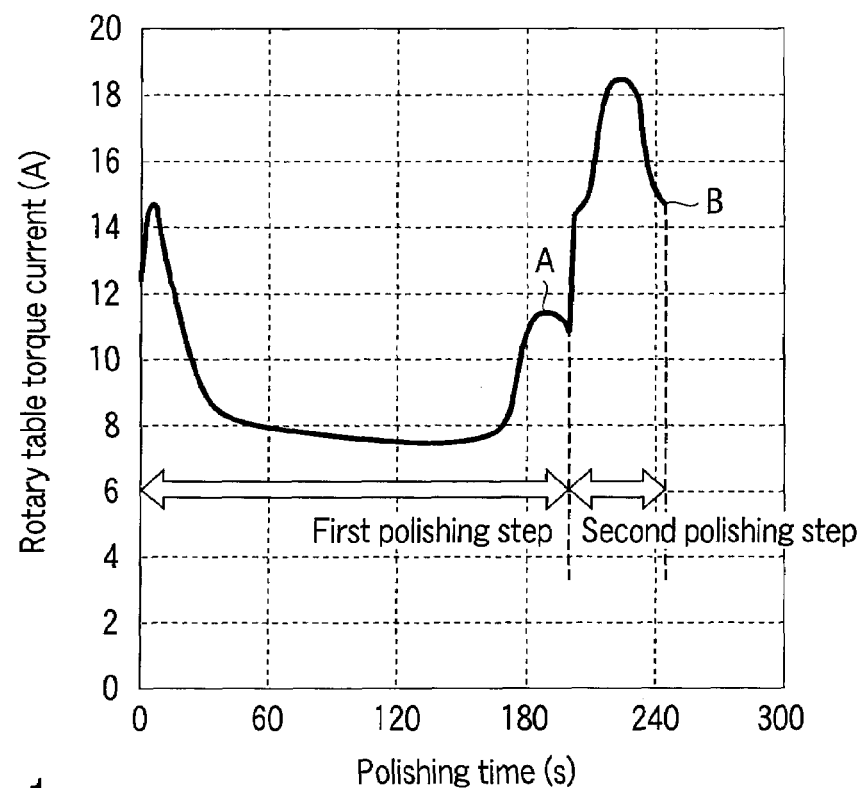
FIG. 1 is a graph illustrating changes in table torque current with polishing time according to one embodiment of the present invention.

Various embodiments of the present invention will now be described with reference to drawings.

In the method of manufacturing a semiconductor device according to one embodiment of the present invention, the polishing process is executed in two steps using polishing liquids differing in composition from each other and under different polishing conditions in the process of polishing an insulating film by means of CMP for embedding the insulating film in the recess formed in a semiconductor substrate.

In the step of CMP to be employed in the element isolation (STI) of a semiconductor device, it is considered necessary to achieve two objects, i.e., the flattening of an insulating film such for example as a silicon oxide film and the removal of a residual silicon oxide film that has been flattened until a stopper film such for example as a silicon nitride film is exposed.

Since it is possible to preferentially remove a projected portion of pattern in the polishing of a silicon oxide film wherein a polishing liquid containing cerium oxide as abrasive particles and anionic surfactant of macromolecular weight is used, this polishing liquid can be suitably employed at the stage of flattening the silicon oxide film. However, when this polishing liquid is employed even after the aforementioned flattening stage, the polishing rate of the silicon oxide film becomes slow and scratches are more likely to be generated on the surface of the silicon oxide film. Therefore, this polishing liquid is not suited for use in the removal of residual silicon oxide film deposited on the silicon nitride film.

In the step of polishing for removing the residual silicon oxide film, it is preferable to employ a polishing method which is characterized by a high polishing rate. However, when the polishing is excessively continued, the silicon nitride film acting as a stopper film may be also polished, thereby raising a problem that the film thickness of the element isolation film may become non-uniform within a semiconductor chip. Therefore, it is desirable to accurately detect the termination of the polishing to be performed for the removal of residual silicon oxide film.

As explained above, in the step of CMP in the STI, it is preferable to switch, at a suitable timing, one polishing step to another polishing step exhibiting different polishing characteristics from said one polishing step and also to terminate the polishing at an appropriate time.

In the method according to one embodiment of the present invention, a first polishing step is performed using a first polishing liquid containing cerium oxide and a first anionic surfactant, thereby flattening the polished surface of the insulating film, and then a second polishing step is performed by making use of a second polishing liquid containing cerium oxide and a second anionic surfactant having a smaller molecular weight than that of the first anionic surfactant under a polishing condition which differs from that of the first polishing step.

The polishing conditions, which are different between the first polishing step and the second polishing step, include polishing pressure, the rotational speed of the polishing table and the rotational speed of the pressure head. For the purpose of detecting the timing of switchover and the termination of polishing, this two-step polishing may desirably be carried out by making use of a CMP apparatus which is capable of monitoring a torque current of the polishing table disposed to face a semiconductor wafer to be polished.

In this two-step polishing, the first polishing step is performed using a first polishing liquid containing a first anionic surfactant, thereby preferentially removing a projected portion of pattern and flattening the polished surface of the insulating film. This flattening can be perceived by detecting an endpoint of ascent in a curve representing changes with time of the torque current of the polishing table. By this recognition of the flattening, it is possible to know the termination of the first polishing step and the timing of switchover from the first polishing step to the second polishing step.

In the second polishing step, the polishing is performed using a second polishing liquid containing a second anionic surfactant having a smaller molecular weight than that of the first anionic surfactant and under a different polishing condition from that of the first polishing step. In this second polishing step, residual insulating film is removed until the stopper film is exposed. By employing this polishing liquid and polishing condition in the second polishing step, it is possible to prevent the generation of scratches on the surface of the insulating film. Furthermore, it is now possible to secure a sufficient selective ratio between the insulating film and the stopper film, thereby making it possible to prevent the polishing of the stopper film.

Further, even if the polishing pressure is reduced in order to prevent the generation of scratches on the surface of insulating film in the second polishing step, it is possible to easily detect the termination of the second polishing step. It may be noted that the termination of the second polishing step can be perceived by detecting an endpoint of descent in a curve representing changes with time of the torque current of the polishing table.

As described above, an appropriate timing for the switchover between the first polishing step and the second polishing step as well as the timing for terminating the second polishing step can be perceived by detecting the ascent endpoint and the descent endpoint from the curve representing changes with time of the torque current of the polishing table.

Generally, while an increase of the rotational speed of the polishing table/pressure head is more advantageous for achieving the flattening of polishing surface, it will make difficult the detection of the termination due to a small difference between the table torque current on the occasion of polishing an insulating film and the table torque current on the occasion of polishing a stopper film. Accordingly, in the first polishing step, the polishing table/pressure head is rotated at a higher rotational speed, thereby making it possible to quickly achieve the flattening of the irregular surface of film. Then, in the second polishing step to enable the stopper film to be exposed, the polishing table/pressure head is rotated at a lower rotational speed, thereby making it possible to easily detect the termination of polishing.

FIG. 1 is a graph illustrating changes in table torque current with CMP time according to this embodiment. As shown in FIG. 1, in the first polishing step, the table torque current was caused to sharply rise from at a point in the vicinity of 160 seconds of polishing time to reach the ascent endpoint "A" of the motor current, which is detected enabling the first polishing to suspend. Namely, when the polishing surface is nearly flattened due to the polishing, the contacting area between the polishing pad disposed on the polishing table and the surface of the object to be polished is caused to increase resulting in increase of frictional force. As a result, the torque of the polishing table and the wafer pressure head is increased, resulting in an increase in motor current in these members. When the flattening of polishing surface is achieved, the contacting area between the polishing pad and the surface of the object would be maximized. Therefore, the frictional force can no longer be increased, making the motor current approximately constant.

Although the first polishing step may be stopped concurrent with the detection of the endpoint of ascent of the table torque current, the first polishing step may be stopped a predetermined time after the detection of the termination. In the example shown in FIG. 1, the first polishing step was stopped a predetermined time later.

Subsequently, when the second polishing step is executed by changing the composition of the polishing liquid as well as the polishing conditions, the insulating film deposited on the stopper film is removed, thus permitting the stopper film to be exposed and, at the same time, the motor current begins to descend. When the stopper film is entirely exposed, the descent of the motor current is stopped, making the motor current approximately constant. This endpoint "B" of descent is detected, thereby enabling the two-step polishing to suspend immediately or after the elapse of a predetermined time.

The reason for the descent of the motor current as soon as the stopper film is exposed can be attributed to the change of the object to be polished due to the exposure of the stopper film. Further, the reason for changing the polishing conditions in the second polishing step is to make clearer the descent of the motor current, which is caused by the exposure of the stopper film. For example, when the rotational speed of the polishing table is lowered, a minute change of friction between the surface to be polished and the polishing pad is sufficiently transmitted to the torque of the polishing table or of the wafer pressure head, thereby making it possible to easily detect the termination of the exposure of stopper film.

In one embodiment of the present invention explained above, the cerium oxide to be contained in the first and the second polishing liquids can be manufactured by any manufacturing method generally known in the art. More specifically, cerium carbonate is employed as a raw material and sintered at a high temperature of several hundreds degree centigrade or more. Then, the resultant sintered material is pulverized by making use of a mill, etc., and classified by means of filtering or levigation, thus removing coarse particles and obtaining cerium oxide particles.

Alternatively, the cerium oxide particles can be manufactured by making use of a mechanochemical process (MCP) wherein a cerium compound such as cerium hydroxide is pulverized together with a diluent such as sodium chloride and then subjected to heat treatment to obtain the cerium oxide particles.

As for the anionic surfactant to be contained in the first and the second polishing liquids, although it is possible to employ fatty acid, salt of fatty acid, polyvalent carboxylic acid-based polymer, alkyl sulfate, alkylbenzene sulfonic acid, or alkylbenzene sulfonate, it is more preferable to employ a surfactant having, as a hydrophilic group, carboxyl group or sulfonyl group.

As for the anionic surfactant having carboxyl group as a hydrophilic group, it is possible to employ a polyvalent carboxylic acid-based polymer selected from the group consisting of polyacrylic acid, polyacrylate, polymethacrylic acid, polymethacylate, acryl-methacrylic acid and acryl-methacrylate. Among these polymers, more preferable examples thereof are polyacrylic acid, poly(potassium acrylate), poly(ammonium acrylate) and poly(ammonium potassium acrylate).

On the other hand, as for the anionic surfactant having sulfonyl group, it is possible to employ alkylbenzene sulfonic acid and salts thereof. For example, it is possible to employ hexylbenzene sulfonic acid, octylbenzene sulfonic acid, dodecylbenzene sulfonic acid, tetradecylbenzene sulfonic acid, hexadecylbenzene sulfonic acid, octadecylbenzene sulfonic acid and salts thereof. Among these materials, more preferable examples thereof are sodium dodecylbenzene sulfonate, potassium dodecylbenzene sulfonate and ammonium dodecylbenzene sulfonate.

With respect to the first anionic surfactant to be contained in the first polishing liquid, it may preferably be selected from those having a molecular weight of 3000-100000. With respect to the second anionic surfactant to be contained in the second polishing liquid, it may preferably be selected from those having a molecular weight of 100-2500, which is far smaller than that of the first anionic surfactant. If the first polishing liquid further contains a third anionic surfactant having a smaller molecular weight than that of the first anionic surfactant, the molecular weight of the third anionic surfactant may preferably be confined within the range of 100-2500. It may be noted that this third anionic surfactant may be the same with or different from the second anionic surfactant to be contained in the second polishing liquid.

When the molecular weight of the first anionic surfactant is smaller than the aforementioned range, the surface of insulating film upon finishing of the first polishing step may become inferior in flatness, thereby making it difficult to detect the termination of the first polishing step. On the other hand, if the molecular weight of the first anionic surfactant is larger than the aforementioned range, the polishing speed would be decreased, thus increasing the polishing time. Further, when the molecular weight of the second anionic surfactant is smaller than the aforementioned range, the thickness of the stopper film may be reduced, the flatness of surface may be degraded and the selective ratio between the insulating film and the stopper film may be decreased. On the other hand, if the molecular weight of the second anionic surfactant is larger than the aforementioned range, scratches may be easily generated on the surface of insulating film. When the polishing pressure is decreased in order to prevent the generation of scratches, it may become difficult to detect the termination of the second polishing step.

With respect to the concentration of the anionic surfactant in the first and second polishing liquid, it may preferably be confined to 0.01-5% by weight. If the concentration of the anionic surfactant is smaller than 0.01% by weight, the quantity of adsorption thereof may become insufficient, thus degrading the effects expected of the anionic surfactant. On the other hand, if the concentration of the anionic surfactant is larger than 5% by weight, the viscosity of the resultant polishing liquid may become too high to easily handle it.

The content of the cerium oxide in the first and second polishing liquid may preferably be confined to 0.05-1% by weight. When the content of cerium oxide is smaller than the aforementioned lower limit, the polishing speed may be decreased. When the content of cerium oxide is larger than the aforementioned upper limit, the selective ratio between the insulating film and the stopper film may be decreased.

Further, the secondary particle diameter of the cerium oxide in a mixture containing the cerium oxide and the second anionic surfactant may preferably be confined to 100-5000 nm. When the secondary particle diameter of the cerium oxide is confined within this range, it is possible secure excellent dispersibility of the cerium oxide. If the secondary particle diameter of the cerium oxide is less than 100 nm, it would become impossible to secure a practical polishing rate. On the other hand, if the secondary particle diameter of the cerium oxide is more than 5000 nm, the generation of scratches may be increased.

The secondary particle diameter can be measured by various methods such as a method based on an observation by means of a transmission electron microscope (TEM), a sieve method, a sedimentation, a centrifugal separation, a dynamic light scattering, image analysis, a laser diffraction scattering, and an ultracentrifugal separation. In these methods, a method based on an observation by means of TEM, and dynamic light scattering are preferred.

Next, the embodiments of the present invention will be explained more specifically with reference to examples and comparative examples.

Example 1

FIGS. 2A-2D are cross-sectional views each illustrating the manufacturing process of a semiconductor device according to one example of the present invention.

Figure 2A:
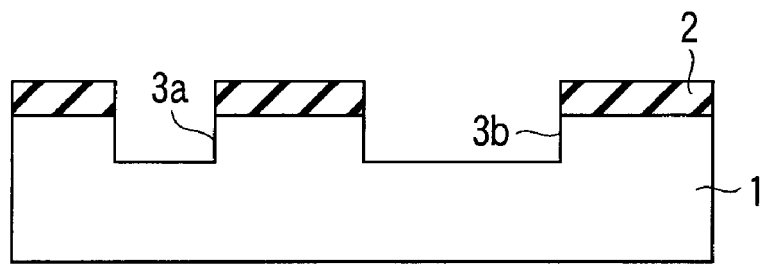
FIGS. 2A-2D are cross-sectional views each illustrating the manufacturing process of a semiconductor device according to Example 1 of the present invention.

First of all, a silicon nitride film 2 to be used as a stopper film was deposited to a film thickness of, for example, 70 nm on the surface of a silicon substrate 1. Then, the silicon nitride film 2 and silicon substrate 1 are subjected to etching by making use of a silicon oxide film as an etching mask, to form an STI pattern constituted by trenches 3a and 3b each having, for example, a depth of 450 nm (FIG. 2A). Incidentally, a silicon oxide film for example may be interposed between the silicon substrate 1 and the silicon nitride film 2.

Figure 2B:
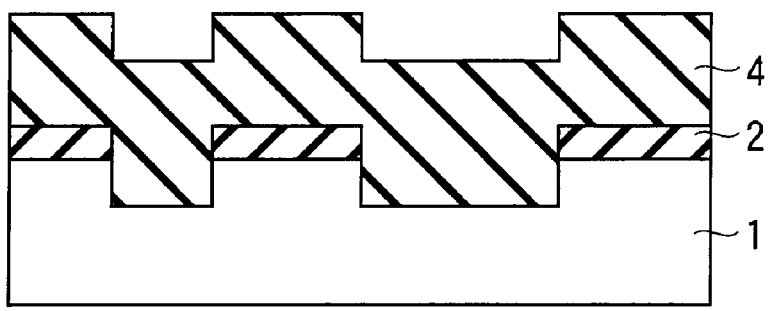
Figure 2C:
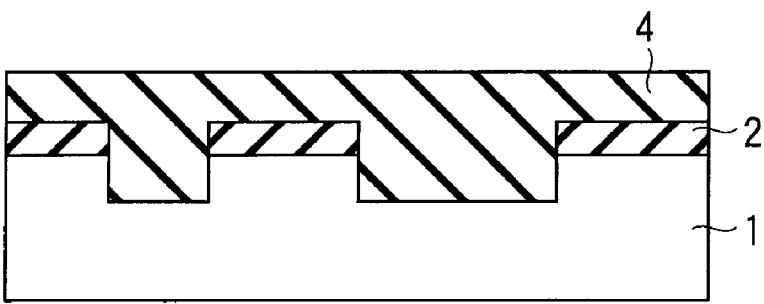

Subsequently, by means of a high-density plasma CVD method (HDP-CVD) for example, a silicon oxide film 4 having a thickness of about 600 nm was deposited on the resultant surface so as to fill the STI pattern with the silicon oxide film 4 (FIG. 2B). As shown in FIG. 2B, the surface of the silicon oxide film 4 was made irregular.

Figure 2D:
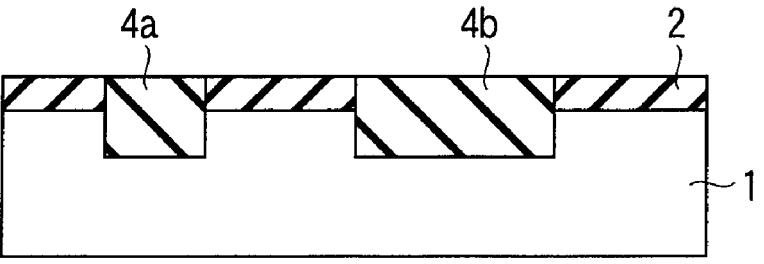

Then, the silicon oxide film 4 was subjected to two-step CMP constituted by a first polishing step and a second polishing step under the conditions shown below. Namely, the silicon oxide film 4 was flattened in the first polishing step (FIG. 2C) and the silicon nitride film 2 was exposed in the second polishing step, thereby obtaining a structure wherein the trenches 3a and 3b were filled with silicon oxide films 4a and 4b (FIG. 2D).

<First Polishing Step (Flattening of Silicon Oxide Film)>

By making use of a polishing liquid having the following composition, the first polishing was performed under the following polishing conditions.

1. Composition of the polishing liquid:
   Abrasive grain: 0.5 wt % of cerium oxide (Hitachi Kasei Industries DLS-2)
   First surfactant: 1.06 wt % of poly (ammonium carboxylate) (Molecular weight: 4000)
   Additional (Third) surfactant: 0.10 wt % of poly (ammonium carboxylate) (Molecular weight: 1000)
2. Polishing conditions:
   Polishing apparatus: F*REX300E (Ebara Seisakusho Co., Ltd.)
   Polishing pad: IC1000/Suba400 (Nitta Harth Co., Ltd.)
   Polishing pressure: 200 hPa
   Rotational speed of top ring/turn table: 107/100 rpm
   Flow rate of polishing liquid: 197 cc/min <Second Polishing Step (Exposure of Silicon Nitride Film)>

By making use of a polishing liquid having the following composition, the second polishing was performed under the following polishing conditions.

1. Composition of the polishing liquid:
   Abrasive grain: 0.5 wt % of cerium oxide (Hitachi Kasei Industries DLS-2)
   Second surfactant: 0.10 wt % of poly (ammonium carboxylate) (Molecular weight: 1000)
2. Polishing conditions:
   Polishing apparatus: F*REX300E (Ebara Seisakusho Co., Ltd.)
   Polishing pad: IC1000/Suba400 (Nitta Harth Co., Ltd.)
   Polishing pressure: 300 hPa
   Rotational speed of top ring/turn table: 66/60 rpm
   Flow rate of polishing liquid: 190 cc/min In the above two-step polishing process, at first, the polishing liquid containing cerium oxide, poly (ammonium carboxylate) having a high molecular weight (4000) and poly (ammonium carboxylate) having a low molecular weight (1000) was employed in the polishing of the silicon oxide film wherein the polishing pad was rotated at a higher rotational speed, thereby achieving a high-speed polishing which was excellent in polishing pressure-responding properties, thus realizing excellent flatness. Then, by making use of the polishing liquid containing cerium oxide and poly (ammonium carboxylate) having a low molecular weight (1000), the polishing of the silicon oxide film was performed, enabling the silicon nitride film to be exposed.

As a result, it was possible to minimize the generation of scratches and the reduction in thickness of the silicon nitride film and to easily detect the termination. The reduction of the generation of scratches may be attributed to the effect of the poly (ammonium carboxylate) of low molecular weight (1000), which makes it possible to enhance the dispersibility of cerium oxide, thus enabling any aggregate (a cause for the generation of scratches) to be dispersed.

Incidentally, it may be conceivable to concurrently use two kinds of surfactants, i.e., a surfactant of low molecular weight and a surfactant of high molecular weight in the second polishing step as in the case of the first polishing step. However, the addition of the surfactant of high molecular weight would promote the aggregation of cerium oxide, thus leading to the generation of scratches. Therefore, in viewpoint of avoiding the generation of scratches, the second polishing liquid comprising only the poly (ammonium carboxylate) of low molecular weight (1000) was employed for performing the polishing to expose the silicon nitride film.

Example 2

The polishing of a silicon oxide film was performed in the same manner as performed in Example 1 except that the polishing pressure in the second polishing step was changed to 150 hPa.

One of the advantages of using a polishing liquid containing the poly (ammonium carboxylate) of low molecular weight (1000) for exposing the silicon nitride film is the easiness of detecting the termination of polishing in addition to the reduction of the generation of scratches due to the enhancement of dispersibility. Namely, due to the incorporation of the poly (ammonium carboxylate) of low molecular weight (1000), a difference in friction between the silicon oxide film and the silicon nitride film is caused to increase. Generally, as the polishing pressure is increased, a difference in friction between the silicon oxide film and the silicon nitride film becomes larger, thereby facilitating the detection of termination of polishing. However, the increase of this difference may be accompanied with a problem of reducing the thickness of the silicon nitride film as well as a problem of increasing the generation of scratches.

In the present invention however, since the second polishing liquid contains poly (ammonium carboxylate) of low molecular weight (1000), it is possible to facilitate the detection of the termination of polishing even if the polishing pressure is lowered, thereby making it possible to inhibit the reduction of the thickness of silicon nitride film and to avoid the generation of scratches.

Example 3

The polishing of a silicon oxide film was performed in the same manner as performed in Example 2 except that sodium dodecylbenzene sulfonate was employed as the second surfactant.

When a polishing liquid containing sodium dodecylbenzene sulfonate of low molecular weight is employed, it is possible to detect the termination of polishing even if the polishing pressure is relatively low. Due to the polishing of low pressure, it is possible to inhibit the reduction of the thickness of silicon nitride film while avoiding the generation of scratches.

Example 4

The polishing of a silicon oxide film was performed in the same manner as performed in Example 1 except that only the first surfactant (poly (ammonium carboxylate) having a high molecular weight (4000)) was employed as a surfactant for the first polishing liquid.

As a result, it was possible to obtain a polished surface having the same excellent features as obtained in Example 1.

Example 5

The polishing of a silicon oxide film was performed in the same manner as performed in Example 2 except that only the first surfactant (poly (ammonium carboxylate) having a high molecular weight (4000)) was employed as a surfactant for the first polishing liquid.

As a result, it was possible to obtain a polished surface having the same excellent features as obtained in Example 2.

Comparative Example 1

The polishing of a silicon oxide film was performed in the same manner as performed in Example 1 except that only poly (ammonium carboxylate) having a high molecular weight of 4000 was employed as a surfactant for the first polishing liquid and that only poly (ammonium carboxylate) having a high molecular weight of 4000 was employed as a surfactant for the second polishing liquid.

As a result, it was impossible to avoid the generation of scratches on the surface of the silicon oxide film.

Comparative Example 2

The polishing of a silicon oxide film was performed in the same manner as performed in Comparative Example 1 except that the polishing pressure in the second polishing step was changed to 150 hPa.

As a result, a difference in friction between the silicon oxide film and the silicon nitride film was too small to detect the termination of polishing.

Comparative Example 3

The polishing of a silicon oxide film was performed in the same manner as performed in Example 1 except that only the poly (ammonium carboxylate) having a low molecular weight of 1000 was employed as a surfactant for the first polishing liquid.

As a result, it was recognized that the flatness of the silicon oxide film obtained from the first polishing step was inferior.

The polishing conditions in the above-described Examples and Comparative Examples and the features of CMP obtained in these Examples and Comparative Examples are summarized in the following Tables 1 and 2.

TABLE 1

|  |  |  | Ex. 1 | Ex. 2 | Ex. 3 | Ex. 4 | Ex. 5 |
|---|---|---|---|---|---|---|---|
| First step | Polishing liquid | Abrasive material | Cerium oxide | Cerium oxide | Cerium oxide | Cerium oxide | Cerium oxide |
|  |  | First surfactant | PCA(4000) | PCA(4000) | PCA(4000) | PCA(4000) | PCA(4000) |
|  |  | Second surfactant | PCA(1000) | PCA(1000) | DBS(348.5) | — | — |
|  | Polishing pressure |  | 200 hPa | 200 hPa | 200 hPa | 200 hPa | 200 hPa |
|  | TR/TT rotational speed |  | 107/100 rpm | 107/100 rpm | 107/100 rpm | 107/100 rpm | 107/100 rpm |
| Features of CMP after 1$^{st}$ step | Flatness |  | Good | Good | Good | Good | Good |
| 2$^{nd}$ step | Polishing liquid | Abrasive material | Cerium oxide | Cerium oxide | Cerium oxide | Cerium oxide | Cerium oxide |
|  |  | First surfactant | — | — | — | — | — |
|  |  | Second surfactant | PCA(1000) | PCA(1000) | DBS(348.5) | PCA(1000) | PCA(1000) |
|  | Polishing pressure |  | 300 hPa | 150 hPa | 150 hPa | 300 hPa | 150 hPa |
|  | TR/TT rotational speed |  | 66/60 rpm | 66/60 rpm | 66/60 rpm | 66/60 rpm | 66/60 rpm |
| Features of CMP after 2$^{nd}$ step | Scratches |  | Medium | Small | Small | Medium | Small |
|  | Reduction in thickness of SiN film |  | Medium | Small | Small | Medium | Small |
|  | Easiness in detecting end point |  | Easy | Easy | Easy | Easy | Easy |

TABLE 2

|  |  |  | Comp. Ex. 1 | Comp. Ex. 2 | Comp. Ex. 3 |
|---|---|---|---|---|---|
| First step | Polishing liquid | Abrasive material | Cerium oxide | Cerium oxide | Cerium oxide |
|  |  | First surfactant | PCA(4000) | PCA(4000) | — |
|  |  | Second surfactant | — | — | PCA(1000) |
|  | Polishing pressure |  | 200 hPa | 200 hPa | 200 hPa |
|  | TR/TT rotational speed |  | 107/100 rpm | 107/100 rpm | 107/100 rpm |
| Features of CMP after 1$^{st}$ step | Flatness |  | Good | Good | Bad |
| 2$^{nd}$ step | Polishing liquid | Abrasive material | Cerium oxide | Cerium oxide | Cerium oxide |
|  |  | First surfactant | PCA(4000) | PCA(4000) | — |
|  |  | Second surfactant | — | — | PCA(1000) |
|  | Polishing pressure |  | 300 hPa | 150 hPa | 300 hPa |
|  | TR/TT rotational speed |  | 66/60 rpm | 66/60 rpm | 66/60 rpm |
| Features of CMP after 2$^{nd}$ step | Scratches |  | Many | Small | Medium |
|  | Reduction in thickness of SiN film |  | Medium | Small | Medium |
|  | Easiness in detecting end point |  | Easy | Difficult | Easy |

Figure 3:
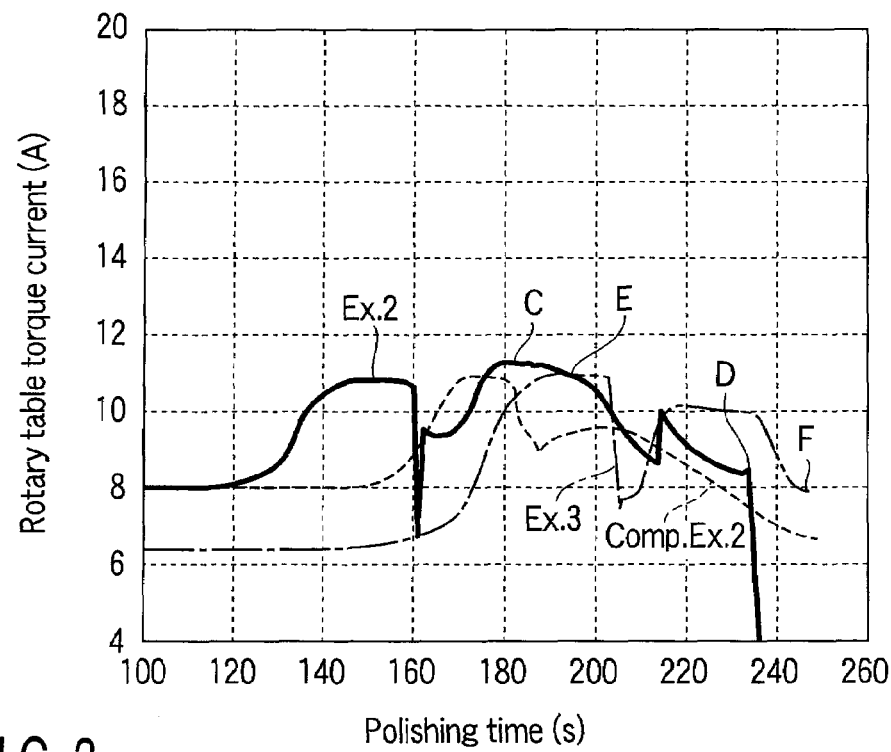
FIG. 3 is a graph illustrating changes in table torque current with polishing time in Examples 2 and 3 and in Comparative Example 2.

FIG. 3 illustrates changes of table torque current relative to the polishing time in Examples 2 and 3 and in Comparative Example 2.

It will be recognized from FIG. 3 that in the cases of Examples 2 and 3, the termination of the first polishing step was detected by the endpoints of ascent "C" and "E" in a curve of the torque current of the polishing table and the termination of the second polishing step was detected by the endpoints of descent "D" and "F" in the curve of the torque current of the polishing table. Whereas, in the case of Comparative Example 2, it was impossible to perceive the endpoint of descent in the curve of the torque current of the polishing table, thus indicating that the detection of the termination of the second polishing step was difficult.

Although the formation of the STI has been discussed in the above examples, it is possible to apply the present invention to the flattening of a gate insulating film or to the flattening of an interlayer insulating film in the process of forming wirings.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, which comprises:
    forming an insulating film above a semiconductor substrate having a recess and stopper film formed above the semiconductor substrate excluding the recess, thereby filling the recess with the insulating film;
    performing a first polishing by polishing the insulating film by means of a chemical mechanical polishing method using a first polishing liquid containing cerium oxide and first anionic surfactant, thereby obtaining a flattened surface; and
    performing a second polishing by polishing the flattened insulating film using a second polishing liquid containing cerium oxide and a second anionic surfactant having a smaller molecular weight than that of the first anionic surfactant under a polishing condition which differs from that of the first polishing, thereby exposing the stopper film.

2. The method according to claim 1, wherein the first polishing and the second polishing are performed by a polishing apparatus equipped with a polishing table which is capable of monitoring torque current thereof and disposed to face an object to be polished, and with a pressure head configured to press the object against the polishing table.

3. The method according to claim 1, wherein said polishing condition of the second polishing, which differs from that of the first polishing, is a polishing pressure which is lower than that of the first polishing.

4. The method according to claim 2, wherein said polishing condition of the second polishing, which differs from that of the first polishing, is a rotational speed of the polishing table and a rotational speed of the pressure head, both of which are lower than those of the first polishing.

5. The method according to claim 2, wherein switchover from the first polishing to the second polishing is performed based on monitoring of an endpoint of ascent in a curve representing changes with time of the torque current of the polishing table.

6. The method according to claim 2, wherein an termination of the second polishing is detected based on monitoring of an endpoint of descent in a curve representing changes with time of the torque current of the polishing table.

7. The method according to claim 1, wherein the first anionic surfactant has a molecular weight of 3000-100000.

8. The method according to claim 1, wherein the second anionic surfactant has a molecular weight of 100-2500.

9. The method according to claim 1, wherein a concentration of the first anionic surfactant in the first polishing liquid is 0.01-5% by weight, and a concentration of the second anionic surfactant in the second polishing liquid is 0.01-5% by weight.

10. The method according to claim 1, wherein the first polishing liquid further contains a third anionic surfactant which is the same with or different from the second anionic surfactant, and is smaller in molecular weight than the first anionic surfactant.

11. The method according to claim 10, wherein the third anionic surfactant has a molecular weight of 100-2500.

12. The method according to claim 8, wherein the second polishing liquid is free of another anionic surfactant having a molecular weight larger than that of the second anionic surfactant.

13. The method according to claim 1, wherein the first and second anionic surfactants are selected from the group consisting of fatty acid, salt of fatty acid, polyvalent carboxylic acid-based polymer, alkyl sulfate, alkylbenzene sulfonic acid, and alkylbenzene sulfonate.

14. The method according to claim 13, wherein each of the first and second anionic surfactants is an anionic surfactant having carboxyl group or sulfonyl group as a hydrophilic group.

15. The method according to claim 14, wherein the anionic surfactant having carboxyl group as a hydrophilic group is a polyvalent carboxylic acid-based polymer selected from the group consisting of polyacrylic acid, polyacrylate, polymethacrylic acid, polymethacylate, acryl-methacrylic acid and acryl-methacrylate.

16. The method according to claim 14, wherein the anionic surfactant having sulfonyl group as a hydrophilic group is a material selected from the group consisting of hexylbenzene sulfonic acid, octylbenzene sulfonic acid, dodecylbenzene sulfonic acid, tetradecylbenzene sulfonic acid, hexadecylbenzene sulfonic acid, octadecylbenzene sulfonic acid and salts of these sulfonic acids.

17. The method according to claim 1, wherein a content of the cerium oxide in the first polishing liquid and second polishing liquid is 0.05-1% by weight.

18. The method according to claim 1, wherein the cerium oxide in a mixture of the cerium oxide and the second anionic surfactant in the second polishing liquid has a secondary particle diameter ranging from 100 to 5000 nm.

19. The method according to claim 1, wherein the insulating film is a silicon oxide film and the stopper film is a silicon nitride film.

20. The method according to claim 1, wherein the insulating film which is left in the recess after the second polishing is an element isolation film.

* * * * *